United States Patent [19]

Sano et al.

[11] 4,302,528
[45] Nov. 24, 1981

[54] PROCESS FOR PRODUCING PHOTO-CURABLE COMPOSITE MATERIALS USEFUL FOR PREPARING STENCILS

[75] Inventors: Takezo Sano, Takatsuki; Haruo Inoue, Kobe; Akihiro Furuta, Takatsuki, all of Japan

[73] Assignee: Sumitomo Chemical Company, Limited, Osaka, Japan

[21] Appl. No.: 56,640

[22] Filed: Jul. 11, 1979

[30] Foreign Application Priority Data

Jul. 12, 1978 [JP] Japan .................. 53-85393

[51] Int. Cl.³ .................. G03C 5/00; G03C 1/78
[52] U.S. Cl. .................. 430/273; 156/295; 156/313; 430/281; 430/308; 430/496; 430/531; 430/935
[58] Field of Search .................. 430/271, 281, 273, 308, 430/935, 496, 531, 270; 427/154, 407 R, 407 C, 428; 156/313, 295

[56] References Cited

U.S. PATENT DOCUMENTS

| | | | |
|---|---|---|---|
| 2,763,572 | 9/1956 | Staehle | 430/935 X |
| 3,287,152 | 11/1966 | Alles et al. | 430/935 X |
| 3,532,052 | 10/1970 | Erickson | 430/308 |
| 3,891,441 | 6/1975 | Tsuji et al. | 430/308 X |
| 3,928,110 | 12/1975 | Arconti et al. | 156/313 X |
| 3,961,961 | 6/1976 | Rich | 430/271 X |
| 4,076,535 | 2/1978 | Van der Putten | 430/271 |
| 4,093,464 | 6/1978 | Ruckert et al. | 430/193 |
| 4,176,602 | 12/1979 | Feddersen | 430/308 |

OTHER PUBLICATIONS

Webster, *Webster's New World Dictionary*, 1968, p. 596.

*Primary Examiner*—Edward C. Kimlin
*Attorney, Agent, or Firm*—Birch, Stewart, Kolasch and Birch

[57] ABSTRACT

An improved process for producing a photo-curable composite material using a liquid photo-curable resin, which comprises holding a liquid photo-curable resin with a screen material between two films, at least one of the films having photo-transmitting properties, and passing the films holding the liquid photo-curable resin and the screen material through a gap (e.g. between two rollers). The process of the present invention can produce photo-curable composite materials useful for preparing various stencils for screen printing, textile printing, or the like at a low cost and with less production of defects.

3 Claims, 1 Drawing Figure

PROCESS FOR PRODUCING PHOTO-CURABLE COMPOSITE MATERIALS USEFUL FOR PREPARING STENCILS

The present invention relates to a process for producing photo-curable composite materials useful for preparing various stencils, such as stencils for screen printing or textile printing, or stencils having hollow patterns. More particularly, it relates to a process for producing photo-curable composite materials comprising holding a liquid photo-curable resin with a screen material between two films, at least one of the films having photo-transmitting properties, and passing the films holding the liquid photo-curable resin and screen material through a gap.

For the preparation of stencils, there have hitherto been used photosensitive resin materials, for example, so-called solvent-dry type sensitizing solutions prepared by dissolving a solid photo-crosslinkable resin in a solvent. However, when this type of solution is coated on a screen material, the solvent evaporates therefrom and it causes pollution of the working environment. Besides, when a thick coating layer of the resin is desired, it should repeatedly be coated, and a long period of time is required for drying the coated product or for exposing it to actinic light to form a pattern or image thereon.

The present inventors have already provided an improved process for producing stencils by using a liquid photo-curable resin, which has advantages over stencils having a thick coating layer, and can easily be produced at a low cost and further development thereof can easily be accomplished. In the case of using a liquid resin in the preparation of stencils, however, it is necessary to shape the resin into a layer having a pre-determined thickness and area before photo-setting thereof by irradiation of actinic light to form images, and hence, it is more difficult to handle it in comparison with the case of using a solid resin. In order to eliminate such a drawback of the liquid resin, the present inventors have also provided an improved photo-curable composite material which comprises sealing a liquid photo-curable resin and a screen material into a flat bag made of two films (cf. U.S. Ser. No. 888,864 now U.S. Pat. No. 4,216,287). This product has an advantage of easy handling like a product using a solid resin. It is, however, very difficult to produce such a product in a high efficiency, because fine air bubbles enter into the product or the films wrinkle in the step of laminating two films and holding therein the liquid photo-curable resin and the screen material, and hence, close attention and a high degree of skill are required in order to prevent occurrence of such defects, which consequently requires much time for the production of the desired product.

As a result of further intensive study by the present inventors, it has been found that the desired photo-curable composite material can be produced in a high efficiency by a simple procedure of holding a liquid photo-curable resin and a screen material between two films and then passing the films through a gap.

An object of the present invention is to provide an' improved process for production of photo-curable composite material. Another object of the invention is to provide an improved photo-curable composite material using a liquid photo-curable resin by a simple process at a low cost. These and other objects of the invention will be apparent from the following description.

According to the present invention, the desired photo-curable composite material can be produced only by holding a liquid photo-curable resin with a screen material between two films and passing the resulting two films through a fixed gap, by which there is obtained a product having a prescribed thickness.

Applying of the liquid photo-curable resin onto the screen material, i.e. covering the whole of the screen material with the liquid photo-curable resin, can be carried out by various methods, for instance, by dipping the screen material into the liquid photo-curable resin, or by coating the screen material with the liquid resin.

The liquid photo-curable resin should be applied to the screen material in a larger amount than that calculated based on the area and thickness of the final stencil. The excess amount of the resin is removed in the step of passing the two films through a gap and is returned to a vessel of resin, by which the fine air bubbles (if any) are removed.

When the application of the resin onto the screen material is carried out by dipping the screen material into the resin and then taking it out therefrom, the amount of the applied resin may vary with the viscosity of the liquid resin. When it is desired to apply the resin in a larger amount, a liquid resin having a higher viscosity is used. A liquid resin having a low viscosity may also be used and applied by a specific means, for instance, by applying the liquid resin just before holding the screen material between two films.

The liquid photo-curable resin used in the present invention is a liquid composition which has a viscosity of 10 to $10^6$ cp at room temperature (25° C.) and can be solidified by photo-crosslinking, photo-polymerization or both when it is irradiated with an actinic light having a wave length ranging from 2,000 to 8,000 Å. Examples of the liquid composition are those containing a photo-polymerization initiator and a compound which has an addition-polymerizable ethylenically unsaturated bond in the molecule thereof. For example, liquid photo-curable resins disclosed in U.S. Pat. No. 2,760,863, French Pat. Nos. 1,591,116 and 1,471,432 and Japanese Patent Publication (unexamined) No. 155,303/1975 can be used. Commercially available liquid resin products for letterpress printing can also be used as the liquid photo-curable resin of the present invention. Examples of these liquid resin products are APR (a trademark of a letterpress printing resin produced and sold by Asahi Chemical Industry Co.), Letter Flex (a trademark of letterpress printing resin produced and sold by W. R. Grace Co.), Tevista (a trademark of letterpress printing resin produced and sold by Teijin Co.), or the like.

Suitable examples of the liquid composition are selected in accordance with the use of the stencils. The composition may also contain other solid materials such as pigments, fillers, reinforcing materials, or the like in an amount such that they do not undesirable effect the photo-curing of the composition. In order to produce continuously the desired photo-curable composite materials, the liquid composition should not have a too high or too low viscosity from the viewpoint of difficulty of applying the liquid composition onto the screen material in a fixed thickness. For this purpose, suitable viscosity is in the range of 300 to 3,000 cp, which may be controlled by varying the temperature.

The liquid photo-curable resin may be applied onto the screen material in an excess amount, and the thickness of layer of the liquid resin depends upon the thickness of the desired composite material but is usually in the range of 10 microns to 10 mm, preferably 50 microns to 5 mm.

The screen material used in the present invention is a sheet material through which liquid can permeate freely and includes, for example, the so-called screen mesh or screen printing or textile printing, cloth or non-woven fabric, net, the so-called metal filter prepared by etching or plating metals, or the like. They may be made of silk, polyesters, polypropylene, high-density polyethylene, nylon, glass, various metals, or the like.

Although the thickness of the screen material depends upon the particular use of the stencil obtained from the composite material of the present invention, it is preferable to be equal to or less than the thickness of the photo-curable resin layer in the inner space formed with the two films. The thickness of the screen material is preferably in the range of 20 microns to 1 mm. The mean size of opening or mesh of the screen material is in the range of 1 micron to 10 mm, preferably 10 microns to 5 mm.

One of the films to be used for holding a liquid photo-curable resin with the screen material should have photo-transmitting properties, flatness and flexibility. The film has enough photo-transmitting properties to permit substantial transmission of actinic light through the film. The film has preferably a transmittance of 50% or more, more preferably 90% or more. Regarding the degree of flatness of the film, it is sufficient that the film is prevented from wrinkling at the image forming portion thereof when the composite material of the present invention is placed on a flat surface or inserted between flat surfaces so as to be irradiated by actinic light. Flexibility of the film is required in order to prevent the composite material from breakage by bending on handling thereof.

The film has usually a thickness of 5 to 100 microns. It is preferable to use a film having 50 microns or less in thickness in order to minimize fogginess of images since, in practice of image formation, a photo-mask is often placed on the outer surface of the film which may cause fogginess of images. Furthermore, it is preferable for the film to have a good peelability since it should be peeled off after photo-setting of a liquid resin to obtain a stencil. Examples of the film are polyethylene, polypropylene, polyesters, polyvinyl chloride, polyamides, cellophane, a laminated film thereof, or the like.

The second of the films need not necessarily have photo-transmitting properties, but should have flatness and flexibility, likewise. Thickness of the film is not critical, but is preferably in the range of 5 microns to 1 mm, more preferably 10 to 500 microns. This other film may, of course, have the same properties as the above film having photo-transmitting properties.

In some cases, it is preferable to previously treat the surface of the film by coating or finishing to provide improved adhesion and reflecting properties.

After holding a liquid resin composition with the screen material between two films, the resulting films are subsequently passed through a gap in order to prepare a product having a fixed thickness. For instance, the films are passed through the gap formed between a plane and a doctor knife, a plane and a roller, or two rollers. Particularly, the suitable gap is formed by two rollers which rotate synchronously with movement of the films. Size of the gap depends upon the thickness of the desired photo-curable composite material and is usually the same as or a little smaller than the total thickness of the screen material, the layer of the photo-curable resin and two films, that is, it is usually in the range of 50 microns to 10 mm.

The process of the present invention is particularly useful for producing the desired photo-curable composite material from a long size of screen material and films. That is, while holding a long screen material, which is continuously passed through a vessel containing a liquid photo-curable resin, between two composite, the resulting films is subsequently continuously passed through a gap formed by two metallic rollers to give a long size of photo-curable composite material having a fixed thickness. The resulting long size of composite material is sealed at an appropriate size and then cut to give the desired photo-curable composite material. Alternatively, the long size of composite material may be irradiated with an actinic light by passing through a photo-mask and thereafter cut in an appropriate size to give the desired stencil.

BRIEF DESCRIPTION OF DRAWINGS

An embodiment of the process of the present invention is illustrated by the accompanying FIGURE wherein the continuous process for producing a photo-curable composite material is represented.

DETAILED DESCRIPTION

Figure 1:
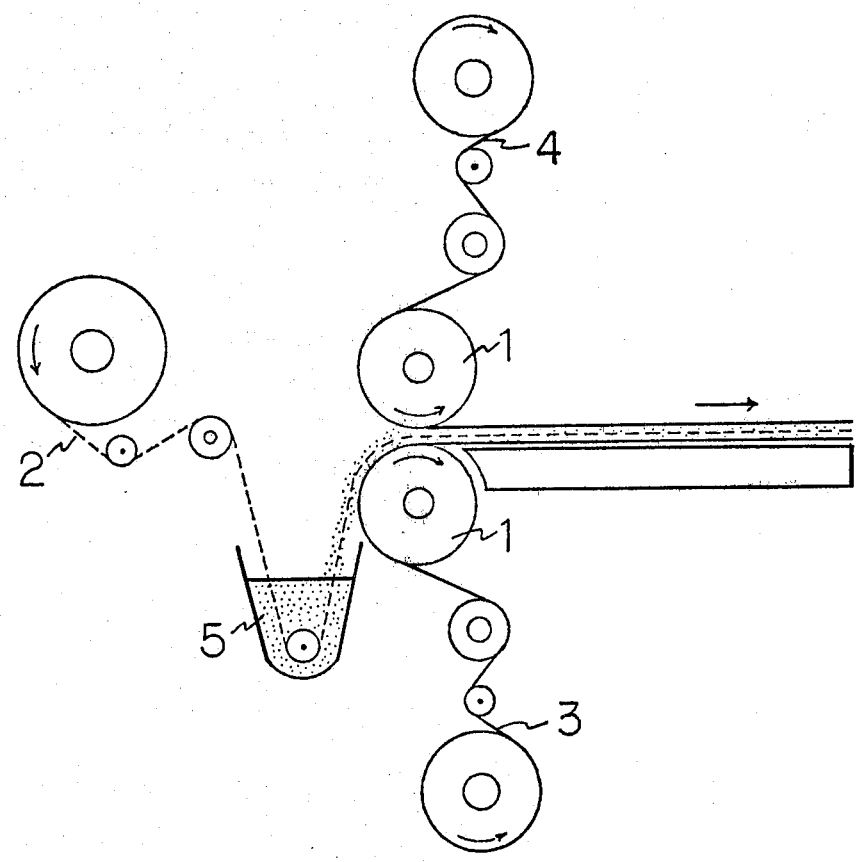

As is shown in the FIGURE, a screen material 2 having a long size is continuously dipped in a vessel which contains a liquid photo-curable resin 5 and is taken out from the vessel and then held or introduced between two films 3 and 4, and the two films holding the liquid photo-curable resin and the screen material are subsequently and continuously passed through two metallic rollers 1 and 1 to give a composite material having a fixed thickness.

The rollers may be made of any kind of materials, such as metals or plastics, as far as a fixed gap can be formed between two rollers, but a chrome-plated metallic roller is preferable from the viewpoint of the smoothness and stability thereof. The rollers may be arranged horizontally, vertically, or at an appropriate angle. When a liquid photo-curable resin having a low viscosity is applied to the screen material in a large amount, it is preferable to arrange the rollers horizontally and to pass downward the two films holding the liquid resin and the screen material through the rollers. When the speed of taking out the screen material applied with the liquid resin is synchronized with the rotating speed of the rollers in the above process, the photo-curable composite material can be produced by an automation system.

According to the process of the present invention, the desired liquid photo-curable composite material can easily be obtained in a short period of time. When the liquid photo-curable resin is applied onto the screen material in a large amount the fine air bubbles are removed together with the excess amount of liquid resin, and further, wrinkle of films is hardly produced by passing them between rollers, and hence, close attention and particular skills are not necessarily required for the preparation, which results in reduction of working time and less production of defects. Moreover, since the composite material can continuously be produced from a long size of screen material and films, these starting materials can effectively be used without waste. The photo-curable resin is merely supplemented into a vessel, and hence, the workroom is not spoiled by the liquid resin. Furthermore, since a composite material having a good thickness accuracy can be obtained, it may be subjected to the photo-setting as it is.

Thus, the process of the present invention is advantageously applicatble to the production of various stencils for screen printing, textile printing or the like with easy procedure and at a low cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A continuous process for producing a photo-curable composite material useful for preparing stencils which comprises applying a liquid photo-curable resin onto a screen material having a thickness of about 20 microns to 1 mm., by passing said screen as a continuously fed sheet of stock material through a vessel containing said liquid photo-curable resin, introducing said screen material between two films such that the films hold the resin and screen material to produce a layered configuration, at least one of said films having photo-transmitting properties capable of transmitting actinic radiation and a thickness of about 5 to 50 microns, the remaining film having a thickness of about 10 to 500 microns, and passing said resulting layered configuration through transport means defining a gap having a size of about 50 microns to 10 mm to produce said composite material having a fixed thickness.

2. A process according to claim 1, wherein the gap is formed between two rollers.

3. The process as disclosed in claim 1, further including the steps of sealing and cutting the composite material to the desired size.

* * * * *